(12) United States Patent
Sugasawara et al.

(10) Patent No.: US 9,882,364 B2
(45) Date of Patent: Jan. 30, 2018

(54) CABLE HOLDING TOOL

(71) Applicants: Sugatsune Kogyo Co., Ltd., Tokyo (JP); SANWA TECHNO CO., LTD., Kobe-shi, Hyogo (JP)

(72) Inventors: Jun Sugasawara, Tokyo (JP); Harunobu Kubota, Tokyo (JP); Toshio Takino, Kobe (JP)

(73) Assignees: SUGATSUNE KOGYO CO., LTD., Tokyo (JP); SANWA TECHNO CO., LTD., Kobe-shi (JP)

( * ) Notice: Subject to any disclaimer, the term of this patent is extended or adjusted under 35 U.S.C. 154(b) by 0 days.

(21) Appl. No.: 15/311,492

(22) PCT Filed: May 8, 2015

(86) PCT No.: PCT/JP2015/063283
§ 371 (c)(1),
(2) Date: Nov. 15, 2016

(87) PCT Pub. No.: WO2015/174333
PCT Pub. Date: Nov. 19, 2015

(65) Prior Publication Data
US 2017/0085073 A1 Mar. 23, 2017

(30) Foreign Application Priority Data
May 15, 2014 (JP) .................... 2014-101392

(51) Int. Cl.
*H02G 3/22* (2006.01)
*H02G 3/04* (2006.01)
(Continued)

(52) U.S. Cl.
CPC ............ *H02G 3/22* (2013.01); *H02G 3/0406* (2013.01); *H02G 3/32* (2013.01); *H05K 7/00* (2013.01)

(58) Field of Classification Search
CPC ................................ H02G 3/22; H02G 3/0406
(Continued)

(56) References Cited

U.S. PATENT DOCUMENTS 9,246,315 B2 * 1/2016 Boyd ................... F16L 5/04
2012/0261156 A1 * 10/2012 Dower ................ H02G 15/18
174/93
2015/0337966 A1 * 11/2015 Shoji ................. F16J 15/3268
277/355

FOREIGN PATENT DOCUMENTS

| JP | 61-179784 U1 | 11/1986 |
| JP | 5255168 B1 | 8/2013 |
| JP | 2014-504136 A | 2/2014 |

OTHER PUBLICATIONS

International Search Authority/JPO, International Search Report dated Jul. 28, 2015 in International Patent Application No. PCT/JP2015/063283 (with English translation), 4 pages.

* cited by examiner

Primary Examiner — Timothy Thompson
Assistant Examiner — Charles Pizzuto
(74) *Attorney, Agent, or Firm* — Masuvalley & Partners (57) ABSTRACT

Provided is a cable holding tool capable of reducing a size of a gap formed at a portion where soft members are sandwiching a cable to thereby increase air-tightness thereat. First sealing members (26a, 26b) having fluffs are attached to a first opposing surface of a soft member (25). Second sealing members (29a, 29b) having fluffs are attached to second opposing surfaces of soft members (28a, 28b). When a cable (17) is sandwiched between the first sealing members (26a, 26b) and the second sealing members (29a, 29b), the fluffs of the first sealing members (26a, 26b) and the fluffs of the second sealing members (29a, 29b) are in contact with each other.

7 Claims, 8 Drawing Sheets

(51) Int. Cl.
    *H02G 3/32* (2006.01)
    *H05K 7/00* (2006.01)
(58) Field of Classification Search
    USPC .......................................................... 174/659
    See application file for complete search history.

Cross-Sectional View Along VIII-VIII

Prior Art

FIG. 11

Prior Art

CABLE HOLDING TOOL

RELATED APPLICATIONS

This application is a national phase application under 35 U.S.C. §371 of International Patent Application No. PCT/JP2015/063283, filed on May 8, 2015, which claims priority under 35 U.S.C. §119 to Japanese Patent Application No. 2014-101392, filed on May 15, 2014, the contents of which are hereby expressly incorporated by reference in their entirety for all purposes.

TECHNICAL FIELD

The present invention relates to a cable holding tool for holding a cable which passes through a wiring opening.

BACKGROUND ART

A working machine includes, for example, a workshop for machining workpieces using tools such as drills and milling cutters, and a control room for controlling processing machinery in the workshop. Control devices such as a driver and a computer are housed in the control room. The processing machinery and the control devices are connected by cables. A wiring opening is opened in a housing of the control room to allow the passage of the cables. A cable holding tool that functions to hold the cables and also functions to block outside air is attached to the housing of the control room. The working machine is arranged inside a factory. Air inside the factory contains dust, oil, coolant fluids, or the like. When the air containing these matters enters the control room, they cause malfunctioning of the control devices. Therefore, the cable holding tool prevents the penetration of the air containing the above matters into the control room through the wiring opening.

Figure 10:
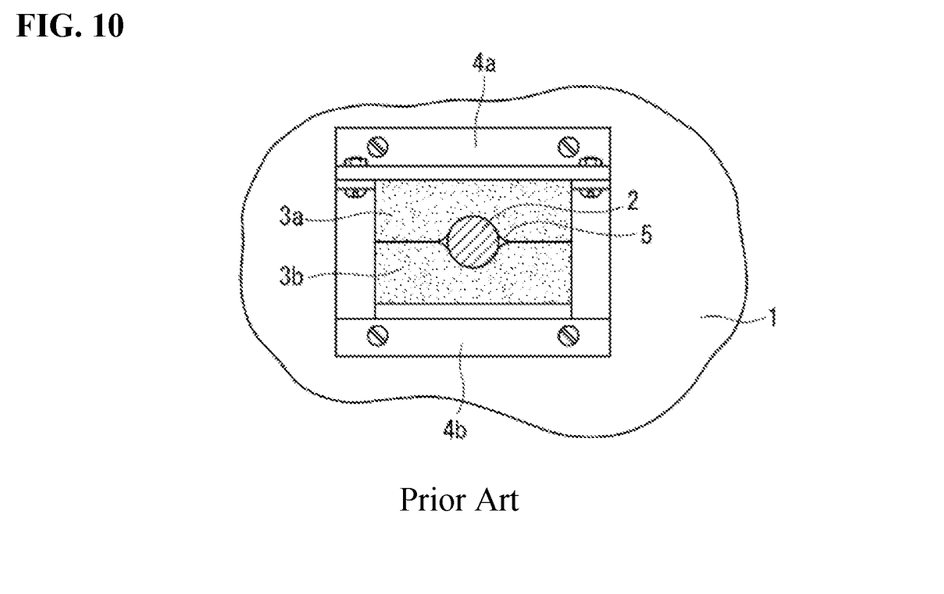
FIG. 10 is a plan view of a conventional cable holding tool.
Figure 11:
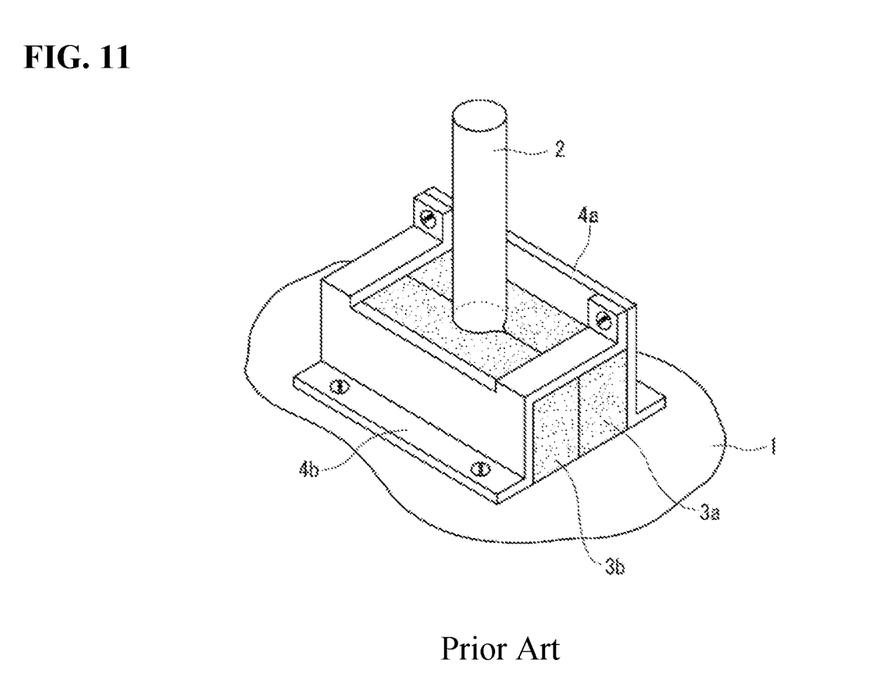
FIG. 11 is a perspective view of the conventional cable holding tool.

A conventional cable holding tool shown in FIG. 10 and FIG. 11 is known (see patent document 1: Japanese Unexamined Utility Model Application Publication No. S61-179784). FIG. 10 is a plan view of the conventional cable holding tool, and FIG. 11 is a perspective view thereof. In FIG. 10, reference numeral 1 represents a housing of the conventional cable holding tool, reference numeral 2 represents a cable passing through the housing 1, reference numerals 3a and 3b represent soft members such as sponges, and reference numerals 4a and 4b represent pressing tools for pressing the soft members 3a and 3b. As shown in FIG. 11, the cable 2 can be held and the wiring opening of the housing 1 can be sealed by sandwiching the cable 2 between the elastically deformable soft members 3a, 3b.

However, with the conventional cable holding tool, small gap(s) 5 (see FIG. 10) are formed at a position where the soft members 3a, 3b are coming together to sandwich the cable 2. As a result of this formation a problem may arise in that inside of the housing 1 communicates with outside air via the gap(s) 5. To solve this problem, it has been proposed to provide a plurality of slits on surfaces of the soft members 3a, 3b that contact the cable 2 to thereby improve elasticity of the soft members 3a, 3b such that the formation of the gap(s) is prevented, but this solution made no changes in the formation of the small gap(s).

Therefore, an object of the present invention is to provide a cable holding tool capable of reducing a size of the gap(s) formed at a position where soft members are sandwiching the cable to thereby increase air-tightness thereat.

SUMMARY OF THE INVENTION

In order to solve the above-mentioned problem, a first aspect of the present invention provides a cable holding tool for holding a cable passing through a wiring opening, the cable holding tool comprising: a soft member having first and second opposing surfaces; a first sealing member having a fluff and attached to the first opposing surface; and a second sealing member having a fluff and attached to the second opposing surface, wherein when a cable is sandwiched between the first sealing member and the second sealing member, the fluff of the first sealing member and the fluff of the second sealing member are in contact with each other.

According to the first aspect of the present invention, the first and second sealing members having the fluffs are attached to the first and second opposing surfaces of the soft member, and the cable is sandwiched between the fluff of the first sealing member and the fluff of the second sealing member, and therefore, a size of the gap formed at a position where the first and second sealing members are sandwiching the cable can be reduced to thereby increase air-tightness thereat.

BRIEF DESCRIPTION OF THE DRAWINGS

The present disclosure is described in conjunction with the appended figures.

DETAILED DESCRIPTION OF THE INVENTION

Figure 1:
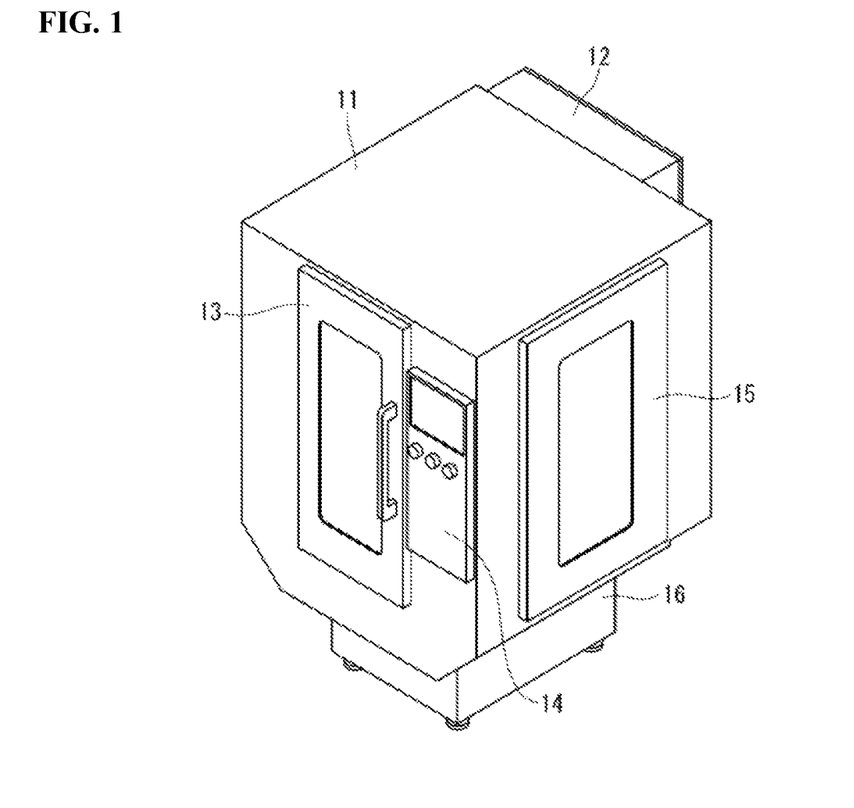
FIG. 1 is a perspective view of a working machine to which a cable holding tool of a first embodiment of the present invention is attached.

A first embodiment of a cable holding tool of the present invention is described based on the attached drawings below. FIG. 1 shows a perspective view of a front surface side of a working machine to which the cable holding tool of the present embodiment is attached. The working machine includes a workshop 11 housing processing machinery for machining workpieces, and a control room 12 housing control devices for controlling the processing machinery. The control room 12 is attached to a back surface of the workshop 11. Note that in FIG. 1, the reference numeral 13 represents a door for inserting and removing the workpieces, the reference numeral 14 represents an operation panel, the reference numeral 15 represents an inspection opening, and the reference numeral 16 represents a coolant tank.

Figure 2:
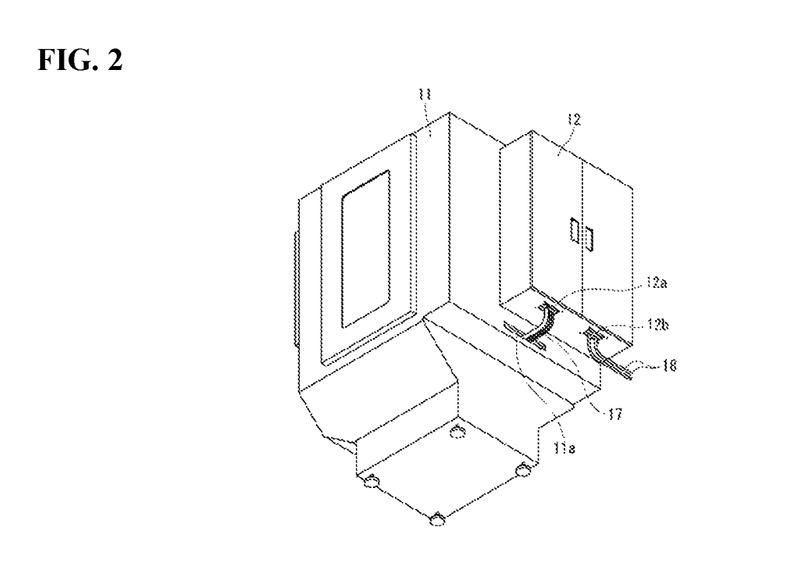
FIG. 2 is a perspective view of a back surface side of the working machine of FIG. 1.

FIG. 2 shows a perspective view of a back surface side of the working machine. The processing machinery in the workshop 11 and the control devices in the control room 12 are connected by cables 17. A wiring opening 11a through which the cables 17 are passed is opened in a housing of the workshop 11. A wiring opening 12a through which the cables 17 are passed is opened in a housing of the control room 12. Furthermore, a wiring opening 12b through which cables 18 for connecting to an external power supply is passed is also opened in the housing of the control room 12.

Figure 3:
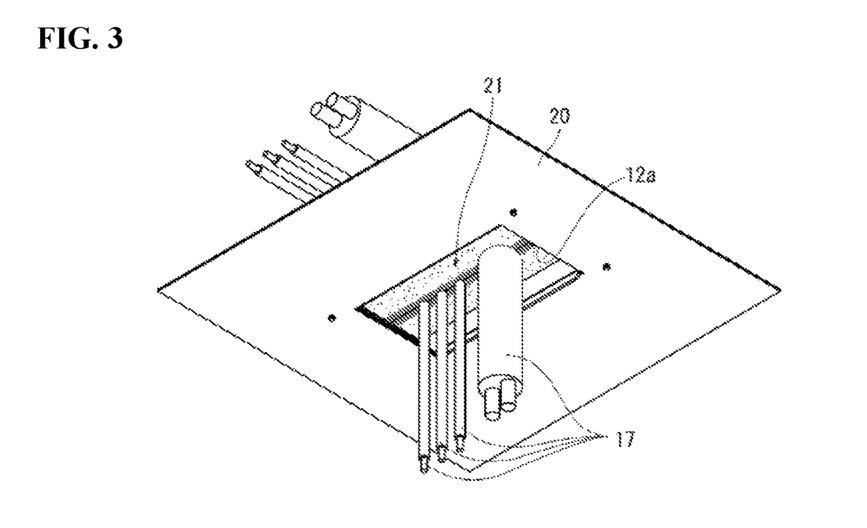
FIG. 3 is a detailed view of a wiring opening of a control room of the working machine of FIG. 1.

FIG. 3 shows a detailed view of the wiring opening 12a of the control room 12. The processing machinery and the control devices are connected by various kinds of the cables 17 such as a power cable and a control cable. The wiring opening 12a, which is square shaped for example, is opened in the housing 20 of the control room 12. A cable holding tool 21 (see FIG. 4) for holding the cables 17 and also sealing the wiring opening 12a is attached to an inner side of the housing 20. The cable holding tool 21 also functions to bend the cables 17 at 90 degrees.

Figure 4:
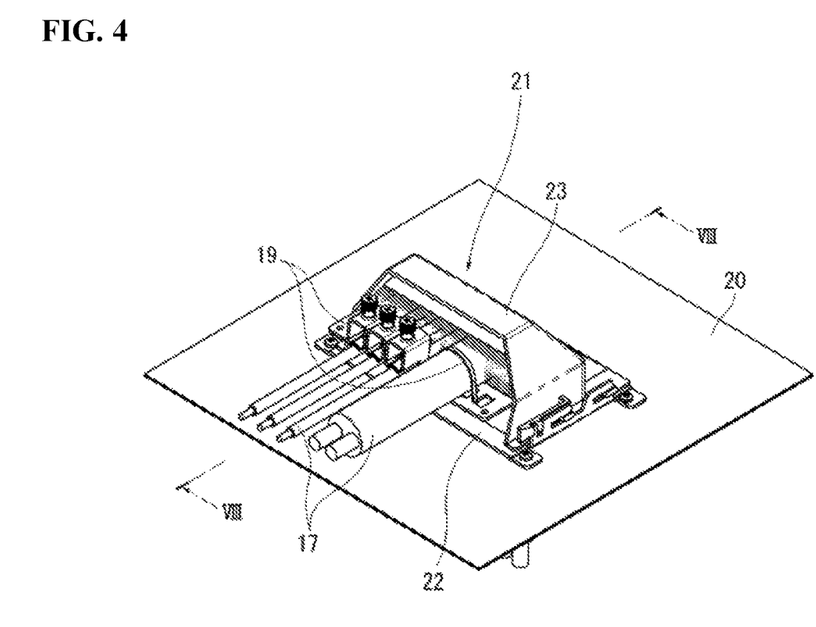
FIG. 4 is a perspective view of the cable holding tool of the present embodiment as viewed from an inner side of a housing.

FIG. 4 shows a perspective view of the cable holding tool 21 as viewed from the inner side of the housing 20. The cable holding tool 21 is configured by combining two members, namely a base part 22 and a cover part 23. The base part 22 is attached to the housing 20 by fastening members such as screws. The cover part 23 is removably attached to the base part 22. The cables 17 are fixed to the base part 22 by cable fasteners 19.

Figure 5:
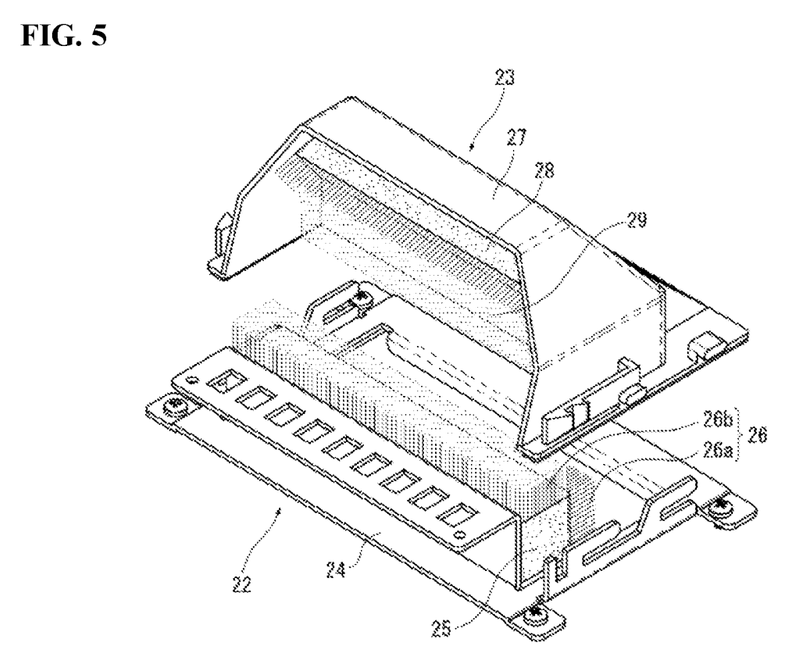
FIG. 5 is a perspective view of the cable holding tool of the present embodiment.

FIG. 5 shows a perspective view of the cable holding tool 21 with the cover part 23 removed from the base part 22. The base part 22 includes a first support member 24 made from a metal frame body surrounding the wiring opening 12a (see FIG. 3), a first soft member 25 adhered to the first support member 24, and a first sealing member 26 adhered to the first soft member 25. The cover part 23 includes a box-shaped second support member 27 made of a synthetic resin and removably attached to the base part 22, a second soft member 28 adhered to the second support member 27, and a second sealing member 29 adhered to the second soft member 28.

Figure 6:
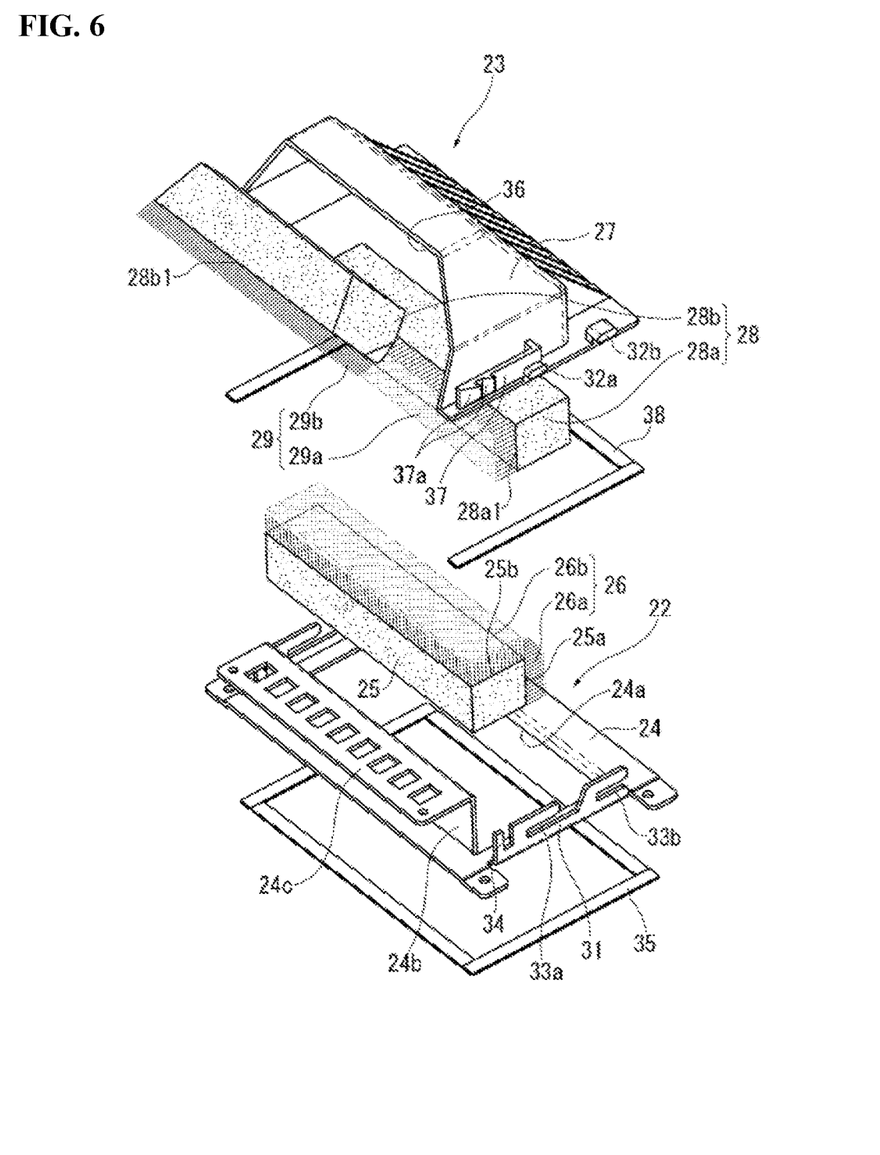
FIG. 6 is an exploded perspective view of the cable holding tool of the present embodiment.

FIG. 6 shows an exploded perspective view of the base part 22 and the cover part 23. A rectangular opening 24a matching the wiring opening 12a (see FIG. 3) is formed in the first support member 24 of the base part 22. The first support member 24 has, in an integrated manner, a seal support part 24b extending along a long side of the rectangular opening 24a, and a cable support stand 24c bent with respect to the seal support part 24b at 90 degrees. The first soft member 25 is attached to the seal support part 24b. The cable fasteners 19 (see FIG. 4) are fixed to the cable support stand 24c. A shape of the first support member 24 is left-right symmetrical. Cover guide walls 31 are integrally formed at both right and left sides of the first support member 24. Each cover guide wall 31 has guide grooves 33a, 33b for guiding guide projections 32a, 32b of the cover part 23, and a standing piece 34 for positioning the cover part 23. A frame-shaped packing 35 is attached to a lower surface of the first support member 24 of the base part 22 to seal between the housing 20 and the first support member 24.

The first soft member 25 is formed in a long and narrow rectangular solid shape, and is attached to the seal support part 24b so as to extend along the long side of the rectangular opening 24a. The first soft member 25 is made from a soft, porous foamed body, and is made from, for example, a sponge obtained by foam molding a synthetic resin such as urethane, a rubber sponge obtained by using rubber as a raw material, and the like.

In FIG. 6, a side surface 25a of the first soft member 25 (this side surface 25a is referred to as a first planar part 25a), and an upper surface 25b of the first soft member 25 (this upper surface 25b is referred to as a second planar part 25b) configure a first opposing surface. The first planar part 25a and the second planar part 25b are orthogonal to each other, and first sealing members 26a, 26b are attached to the first and second planar parts 25a, 25b.

The second support member 27 of the cover part 23 has a seal housing part 36 formed in a box shape, the guide projections 32a, 32b, and hooks 37. Second soft members 28a, 28b are attached to an inner wall of the seal housing part 36. The second soft members 28a, 28b are both formed as long and narrow rectangular solids. Similar to the first soft member 25, the second soft members 28a, 28b are also made from soft, porous foamed bodies.

A side surface 28a1 of the second soft member 28a (this side surface 28a1 is referred to as a third planar part 28a1) is parallel to the first planar part 25a of the first soft member 25. A side surface 28b1 of the second soft member 28b (this side surface is referred to as a fourth planar part 28b1) is inclined with respect to the third planar part 28a1 at 40 to 60 degrees so as to approach the first soft member 25. The third planar part 28a1 and the fourth planar part 28b1 configure a second opposing surface. Second sealing members 29a, 29b are attached to the third and fourth planar parts 28a1, 28b1.

A shape of the second support member 27 is left-right symmetrical. The guide projections 32a, 32b and the hook 37 of the second support member 27 are arranged at each of the right and left sides of the second support member 27. When the guide projections 32a, 32b of the second support member 27 are fitted into the guide grooves 33a, 33b of the first support member 24, and the second support member 27 is moved in one direction (a direction along a short side of the rectangular opening 24a) to a predetermined position while bending the hooks 37, the hooks 37 are restored due to an elastic force thereof such that triangular claws 37a of the hooks 37 catch on the standing pieces 34 of the first support member 24. In this way, the second support member 27 is fixed to the first support member 24. A plurality of claws 37a are formed in the hooks 37 such that a position of the second support member 27 can be adjusted in multiple steps. A U-shaped packing 38 is attached to a lower surface of the second support member 27 to seal between the first support member 24 and the second support member 27.

Figure 7:
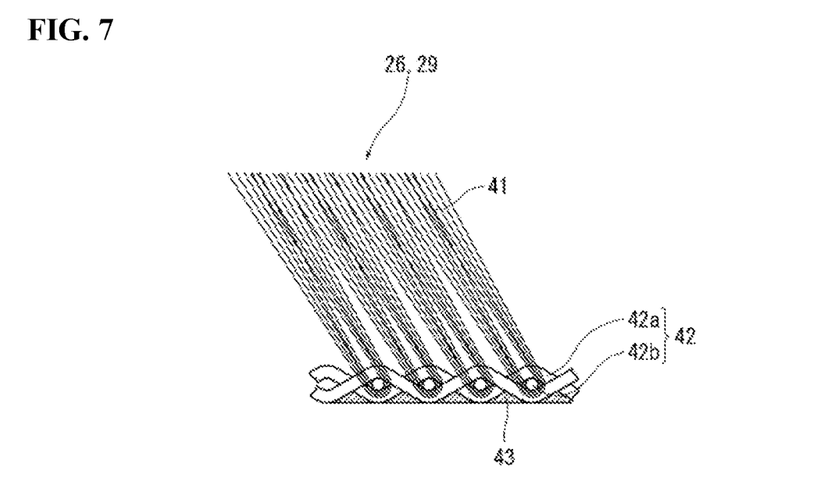
FIG. 7 is a cross-sectional view of first and second sealing members of the present embodiment.

FIG. 7 shows a cross-sectional view of the first and second sealing members 26, 29. The first and second sealing members 26, 29 have the same configuration. Each of the first and second sealing members 26, 29 includes a pile yarn 41 as the fluff, a base fabric 42 to support the pile yarn 41, and a coating layer 43 to prevent the pile yarn 41 from falling off. The base fabric 42 is a textile or knitted fabric obtained by weaving a weft 42a and a warp 42b. The pile yarn 41 is pile weaved to the base fabric 42. The pile yarn 41 is formed in a loop shape or in a cut shape obtained by cutting loops (FIG. 7 shows the pile yarn 41 having the cut shape) to thereby have flexibility. The coating layer 43 is formed by applying a coating agent to the base fabric 42 from a back surface thereof. The first and second sealing members 26, 29 are adhered to the first and second soft members 25, 28 by an adhering means such as a double sided tape and an adhesive. Note that adherence can also be done using the coating layers 43 of the first and second sealing members 26, 29.

A material of the fibers of the base fabric 42 is not particularly limited, and can contain, for example, 55% of acrylic and 45% of polyester. A length, warp, and density of the fibers of the pile yarn 41 are also not particularly limited, and, for example, the length of the pile (fluff portion) can be 3 mm to 30 mm; the fineness of the fibers can be 0.8 denier to 15 denier, the density of the fibers can be 16 gauge to 22 gauge per inch in a width direction, and the mesh number in a longitudinal direction can be 16 to 32 meshes per inch. If oil is coated onto the pile yarn 41 such that the pile yarn 41 contains the oil, penetration of air containing oil, coolant fluid, dust or the like can be effectively prevented. As the oil, silicone-based oil and fluorine-based oil can be used for example.

Figure 8:
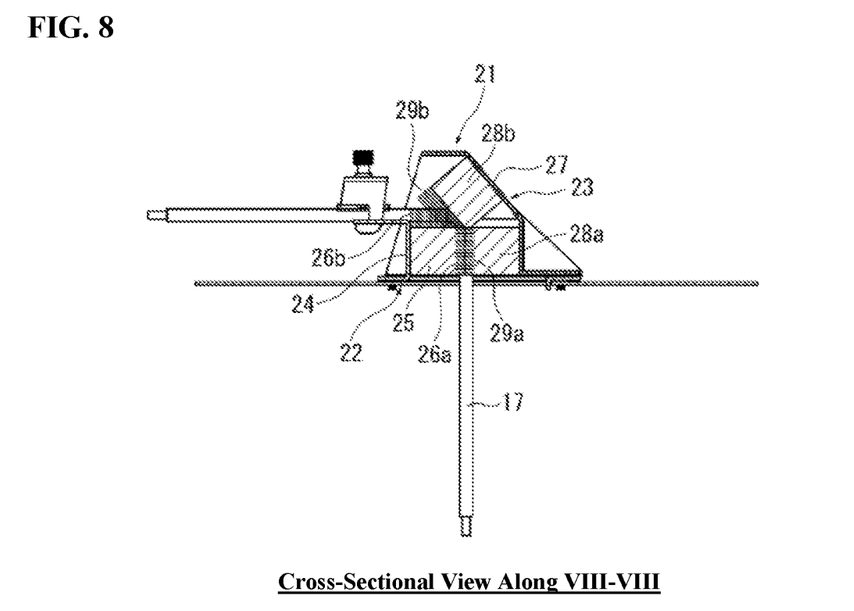
FIG. 8 is a cross-sectional view along VIII-VIII of FIG. 4.

FIG. 8 shows a cross-sectional image of the cable holding tool 21 with the cover part 23 fixed to the base part 22. When the cover part 23 is fixed to the base part 22, the cables 17 are sandwiched between the first sealing members 26a, 26b attached to the first soft member 25 and the second sealing members 29a, 29b attached to the second soft members 28a, 28b. At this time, the pile yarn 41 of the first sealing member 26 and the pile yarn 41 of the second sealing member 29 are in contact with each other. The first soft member 25 and the second soft member 28 are softer than the first support member 24 made of the metal and the second support member 27 made of the resin, which support the first and second soft members 25, 28, and therefore the first soft member 25 and the second soft members 28a, 28b elastically deform. Even if the first and second soft members 25, 28a, 28b elastically deform, the pile yarns 41 of the first sealing members 26a, 26b and the pile yarns 41 of the second sealing members 29a, 29b seal the gaps which are formed along circumferences of the cables 17. Therefore, a cable holding tool 21 having a high level of air-tightness is obtained.

Furthermore, by providing the first soft member 25 with the first and second planar parts 25a, 25b (see FIG. 6) orthogonal to each other, and by providing the second soft member 28a with the third planar part 28a1 parallel to the first planar part 25a and with the fourth planar part 28b1 inclined with respect to the third planar part 28a1, the pile yarns 41 of the first sealing members 26a, 26b attached to the first and second planar parts 25a, 25b and the pile yarns 41 attached to the third and fourth planar parts 28a1, 28b1 can come in contact with each other. Therefore, even if the cables 17 are bent at 90 degrees, the air-tightness of the cable holding tool 21 can be improved.

Figure 9:
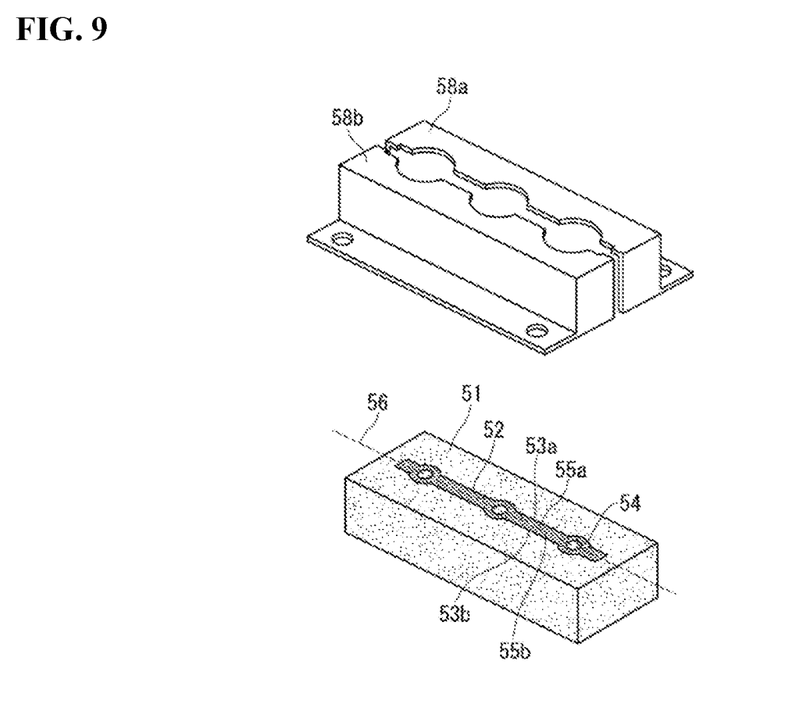
FIG. 9 is a perspective view of a cable holding tool of a second embodiment of the present invention.

FIG. 9 shows a perspective view of a cable holding tool according to a second embodiment of the present invention. With the above-described first embodiment, the first soft member 25 and the second soft member 28 are separated from each other, however in this embodiment, there exist only one soft member 51 which is made from a single component. As can be seen from this figure, a slit 52 is made at a center of the soft member 51. Wall surfaces defining the slit 52 configure first and second opposing surfaces 53a, 53b. Semicircular indentations 54 are formed on the first and second opposing surfaces 53a, 53b of this embodiment at positions where the cables 17 are sandwiched there-between. First and second sealing members 55a, 55b are attached to the first and second opposing surfaces 53a, 53b. The reference numeral 56 in FIG. 9 represents a boundary between the first and second sealing members 55a, 55b. The soft member 51 is covered by case half bodies 58a, 58b as first and second support members divided into two. Screw holes for attachment to the housing 20 are formed in the case half bodies 58a, 58b. As with this embodiment, the soft member 51 can also be configured from the single component.

Note that the present invention is not limited to the above-described embodiments, and may be changed to various embodiments without changing the scope of the present invention.

With the above-mentioned embodiment, the cable holding tool that bends the cables at 90 degrees was described, but the cables may be linearly extended as well.

With the above-mentioned embodiments, examples for which the cable holding tool is attached to the housing of the control room of the working machine were described, but the cable holding tool can also be attached to the housing of the workshop of the working machine.

The cable holding tool of the present invention can be attached to not only the working machine, but also various machinery such as transportation machinery, construction machinery, agricultural machinery, woodworking machinery, robots, semiconductor manufacturing equipment or liquid crystal manufacturing equipment, or buildings and the like.

The present specification is based on Japanese Patent Application No. 2014-101392 filed May 15, 2014. The details described herein are all included therein.

What is claimed is:

1. A cable holding tool for holding a cable passing through a wiring opening, the cable holding tool comprising:
   a soft member having first and second opposing surfaces, said soft member comprises a porous foam and is configured for attachment to the wiring opening;
   a first sealing member having a fluff and attached to the first opposing surface; and
   a second sealing member having a fluff and attached to the second opposing surface,
   wherein when a cable is sandwiched between the first sealing member and the second sealing member, the soft member making an elastic deformation while the fluff of the first sealing member and the fluff of the second sealing member are in contact with each other.

2. The cable holding tool according to claim 1, wherein each of the first and second sealing members has a pile yarn as the fluff, and a base fabric for supporting the pile yarn.

3. The cable holding tool according to claim 1, wherein the soft member includes a first soft member having the first opposing surface, and a second soft member having the second opposing surface.

4. The cable holding tool according to claim 1, wherein the first opposing surface has a first planar part and a second planar part orthogonal to the first planar part,
   the second opposing surface has a third planar part parallel to the first planar part, and a fourth planar part inclined with respect to the third planar part.

5. The cable holding tool according to claim 3 further comprising:
   a first support member for supporting the first soft member and being harder than the first soft member; and
   a second support member for supporting the second soft member and being harder than the second soft member.

6. The cable holding tool according to claim 4, wherein the fluff of the first sealing member attached to the first planar part and the fluff of the second sealing member attached to the third planar part are in contact with each other.

7. The cable holding tool according to claim 4, wherein the fluff of the first sealing member attached to the second planar part and the fluff of the second sealing member attached to the fourth planar part are in contact with each other.

* * * * *